United States Patent
Yu et al.

(10) Patent No.: US 11,462,530 B2
(45) Date of Patent: Oct. 4, 2022

(54) MULTI-STACK PACKAGE-ON-PACKAGE STRUCTURES

(71) Applicant: Taiwan Semiconductor Manufacturing Co., Ltd., Hsinchu (TW)

(72) Inventors: Chen-Hua Yu, Hsinchu (TW); An-Jhih Su, Taoyuan (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 38 days.

(21) Appl. No.: 17/026,825

(22) Filed: Sep. 21, 2020

(65) Prior Publication Data
US 2021/0005594 A1    Jan. 7, 2021

Related U.S. Application Data

(60) Continuation of application No. 16/590,992, filed on Oct. 2, 2019, now Pat. No. 10,784,248, which is a
(Continued)

(51) Int. Cl.
*H01L 23/48* (2006.01)
*H01L 25/00* (2006.01)
(Continued)

(52) U.S. Cl.
CPC .............. *H01L 25/50* (2013.01); *H01L 21/56* (2013.01); *H01L 23/3157* (2013.01);
(Continued)

(58) Field of Classification Search
CPC . H01L 23/3107; H01L 23/28; H01L 23/5389; H01L 2224/0233
(Continued)

(56) References Cited

U.S. PATENT DOCUMENTS 6,271,469 B1    8/2001 Ma et al.
6,495,914 B1    12/2002 Sekine et al.
(Continued)

FOREIGN PATENT DOCUMENTS

CN    1624888 A    6/2005
CN    103050486 A    4/2013
(Continued)

*Primary Examiner* — Nitin Parekh
(74) *Attorney, Agent, or Firm* — Slater Matsil, LLP

(57) ABSTRACT

A package includes a first device die, and a first encapsulating material encapsulating the first device die therein. A bottom surface of the first device die is coplanar with a bottom surface of the first encapsulating material. First dielectric layers are underlying the first device die. First redistribution lines are in the first dielectric layers and electrically coupling to the first device die. Second dielectric layers are overlying the first device die. Second redistribution lines are in the second dielectric layers and electrically coupling to the first redistribution lines. A second device die is overlying and electrically coupling to the second redistribution lines. No solder region connects the second device die to the second redistribution lines. A second encapsulating material encapsulates the second device die therein. A third device die is electrically coupled to the second redistribution lines. A third encapsulating material encapsulates the third device die therein.

20 Claims, 18 Drawing Sheets

Related U.S. Application Data continuation of application No. 15/676,202, filed on Aug. 14, 2017, now Pat. No. 10,490,540, which is a division of application No. 14/972,622, filed on Dec. 17, 2015, now Pat. No. 9,735,131.

(60) Provisional application No. 62/253,401, filed on Nov. 10, 2015.

(51) Int. Cl.
| | |
|---|---|
| *H01L 23/00* | (2006.01) |
| *H01L 23/538* | (2006.01) |
| *H01L 25/10* | (2006.01) |
| *H01L 21/56* | (2006.01) |
| *H01L 23/31* | (2006.01) |
| *H01L 25/065* | (2006.01) |

(52) U.S. Cl.
CPC .......... *H01L 23/5389* (2013.01); *H01L 24/19* (2013.01); *H01L 24/20* (2013.01); *H01L 25/0657* (2013.01); *H01L 25/105* (2013.01); H01L 21/568 (2013.01); H01L 2224/04105 (2013.01); H01L 2224/12105 (2013.01); H01L 2224/18 (2013.01); H01L 2224/19 (2013.01); H01L 2224/32145 (2013.01); H01L 2224/32225 (2013.01); H01L 2224/48091 (2013.01); H01L 2224/48227 (2013.01); H01L 2224/73265 (2013.01); H01L 2224/73267 (2013.01); H01L 2224/92244 (2013.01); H01L 2225/0651 (2013.01); H01L 2225/06524 (2013.01); H01L 2225/06544 (2013.01); H01L 2225/06562 (2013.01); H01L 2225/1035 (2013.01); H01L 2225/1041 (2013.01); H01L 2225/1058 (2013.01); H01L 2924/18162 (2013.01)

(58) Field of Classification Search
USPC ........................................................ 257/774
See application file for complete search history.

(56) References Cited

U.S. PATENT DOCUMENTS

| | | | |
|---|---|---|---|
| 7,667,318 B2 | 2/2010 | Yang et al. | |
| 7,830,004 B2 | 11/2010 | Wu | |
| 7,989,950 B2* | 8/2011 | Park ...................... | H01L 25/105 |
| | | | 257/724 |
| 8,004,095 B2 | 8/2011 | Shim et al. | |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,779,606 B2 | 7/2014 | Yim et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,878,360 B2 | 11/2014 | Meyer et al. | |
| 8,941,225 B2* | 1/2015 | Choi ...................... | H01L 25/105 |
| | | | 438/109 |
| 9,177,926 B2 | 11/2015 | Scanlan et al. | |
| 9,490,167 B2 | 11/2016 | Chen et al. | |
| 9,666,572 B2 | 5/2017 | Lin et al. | |
| 9,728,495 B2* | 8/2017 | Haba .................. | H01L 25/0655 |
| 9,735,134 B2 | 8/2017 | Chen | |
| 9,746,889 B2 | 8/2017 | Mittal et al. | |
| 10,109,613 B2 | 10/2018 | Lin et al. | |
| 2001/0030059 A1 | 10/2001 | Sugaya et al. | |
| 2003/0141105 A1 | 7/2003 | Sugaya et al. | |
| 2007/0035033 A1 | 2/2007 | Ozguz et al. | |
| 2008/0136004 A1 | 6/2008 | Yang et al. | |
| 2008/0246126 A1 | 10/2008 | Bowles et al. | |
| 2010/0117218 A1* | 5/2010 | Park ...................... | H01L 23/5384 |
| | | | 257/693 |
| 2010/0133704 A1 | 6/2010 | Marimuthu et al. | |
| 2010/0304530 A1 | 12/2010 | Yim et al. | |
| 2011/0204505 A1 | 8/2011 | Pagaila et al. | |
| 2011/0291288 A1 | 12/2011 | Wu et al. | |
| 2012/0161331 A1 | 6/2012 | Gonzalez et al. | |
| 2012/0273960 A1* | 11/2012 | Park .................. | H01L 23/49827 |
| | | | 257/774 |
| 2012/0280404 A1 | 11/2012 | Kwon et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0105991 A1 | 5/2013 | Gan et al. | |
| 2013/0168848 A1 | 7/2013 | Lin et al. | |
| 2013/0307140 A1 | 11/2013 | Huang et al. | |
| 2013/0328177 A1 | 12/2013 | Cho et al. | |
| 2014/0001612 A1 | 1/2014 | Yu et al. | |
| 2014/0203338 A1 | 7/2014 | Kelly et al. | |
| 2014/0203429 A1 | 7/2014 | Yu et al. | |
| 2014/0225222 A1 | 8/2014 | Yu et al. | |
| 2014/0248742 A1 | 9/2014 | Gonzalez et al. | |
| 2014/0252572 A1 | 9/2014 | Hou et al. | |
| 2014/0252646 A1 | 9/2014 | Hung et al. | |
| 2014/0264930 A1 | 9/2014 | Yu et al. | |
| 2014/0273348 A1 | 9/2014 | Yim et al. | |
| 2015/0091149 A1 | 4/2015 | Jang et al. | |
| 2015/0171006 A1 | 6/2015 | Hung et al. | |
| 2015/0249065 A1* | 9/2015 | Pagaila .................. | H01L 25/03 |
| | | | 257/737 |
| 2015/0303174 A1* | 10/2015 | Yu ...................... | H01L 21/6835 |
| | | | 257/712 |
| 2016/0190107 A1 | 6/2016 | Meyer et al. | |
| 2016/0228333 A1* | 8/2016 | Bukstein ............... | A61J 7/0418 |
| 2016/0260682 A1 | 9/2016 | Scanlan et al. | |
| 2016/0276307 A1 | 9/2016 | Lin | |
| 2018/0190581 A1* | 7/2018 | Lin .................. | H01L 21/76895 |

FOREIGN PATENT DOCUMENTS

| | | |
|---|---|---|
| CN | 103515305 A | 1/2014 |
| CN | 103545288 A | 1/2014 |
| CN | 103730434 A | 4/2014 |
| CN | 104916605 A | 9/2015 |
| DE | 112011104502 T5 | 12/2013 |
| KR | 20160137962 A | 12/2016 |
| TW | I441312 B | 6/2014 |
| TW | I467668 B | 1/2015 |
| WO | 2012012338 A1 | 1/2012 |
| WO | 2015147842 A1 | 10/2015 |

\* cited by examiner

MULTI-STACK PACKAGE-ON-PACKAGE STRUCTURES

PRIORITY CLAIM AND CROSS-REFERENCE

This application is a continuation of U.S. patent application Ser. No. 16/590,992, entitled "Multi-Stack Package-on-Package Structures," filed on Oct. 2, 2019, which is a continuation of U.S. patent application Ser. No. 15/676,202, entitled "Multi-Stack Package-on-Package Structures," filed on Aug. 14, 2017, now U.S. Pat. No. 10,490,540 issued Nov. 26, 2019, which application is a divisional of U.S. patent application Ser. No. 14/972,622, entitled "Multi-Stack Package-on-Package Structures," filed on Dec. 17, 2015, now U.S. Pat. No. 9,735,131 issued Aug. 15, 2017, which application claims the benefit of the U.S. Provisional Application No. 62/253,401, filed Nov. 10, 2015, and entitled "Multi-Stack Package on Package-on-Package Structures," which applications are hereby incorporated herein by reference.

BACKGROUND

In a conventional Integrated Fan-Out (InFO) process, a top package, in which a first device die is bonded, is bonded to a bottom package. The bottom package may also have a device die packaged therein. By adopting the InFO process, the integration level of the packages is increased.

In an existing InFo process, the bottom package is formed first, which includes encapsulating a molding compound on a device die and a plurality of through-molding vias. Redistribution lines are formed to connect to the device die and the through-molding vias. A top package, which may include device dies bonded to an additional package substrate, is then bonded to the bottom package through solder joints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 11A illustrate the cross-sectional views of intermediate stages in the formation of a package including multi-stack dies in accordance with some embodiments.

FIGS. 11B through 16 illustrate the cross-sectional views of packages including multi-stack dies in accordance with some embodiments.

DETAILED DESCRIPTION

Figure 1:
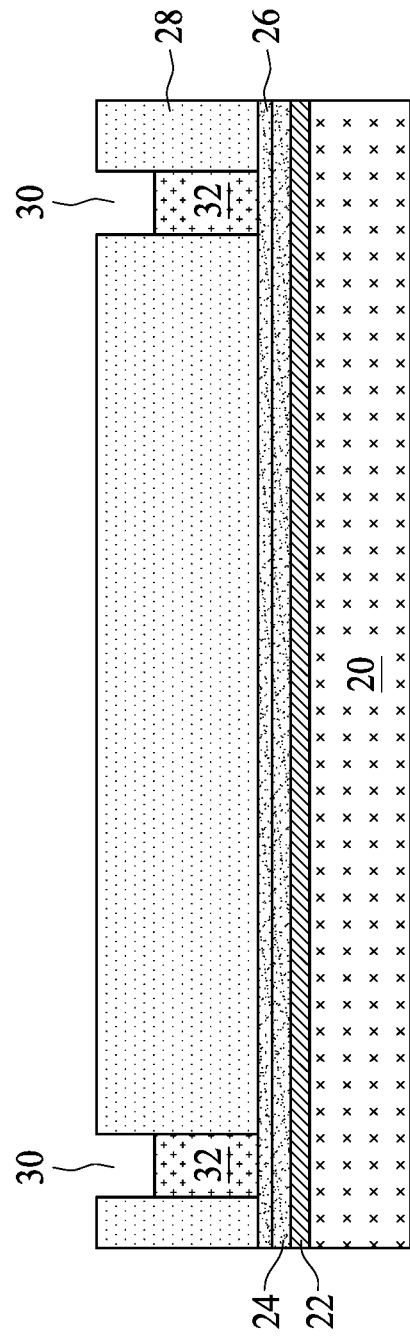

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A multi-stack package and the method of forming the package are provided in accordance with various exemplary embodiments. Some variations of some embodiments are discussed. Throughout the various views and illustrative embodiments, like reference numbers are used to designate like elements. Throughout the description, the term "multi-stack package" refers to a package in which two or more levels of device dies, each encapsulated in an encapsulating material, have no solder regions therebetween. Furthermore, throughout the description, the surfaces of device dies having metal pillars are referred to as the front surfaces of the respective device dies, and the surfaces opposite to the front surfaces are back surfaces. The back surfaces are also the surfaces of semiconductor substrates of the respective device dies in accordance with some embodiments.

Figure 17:
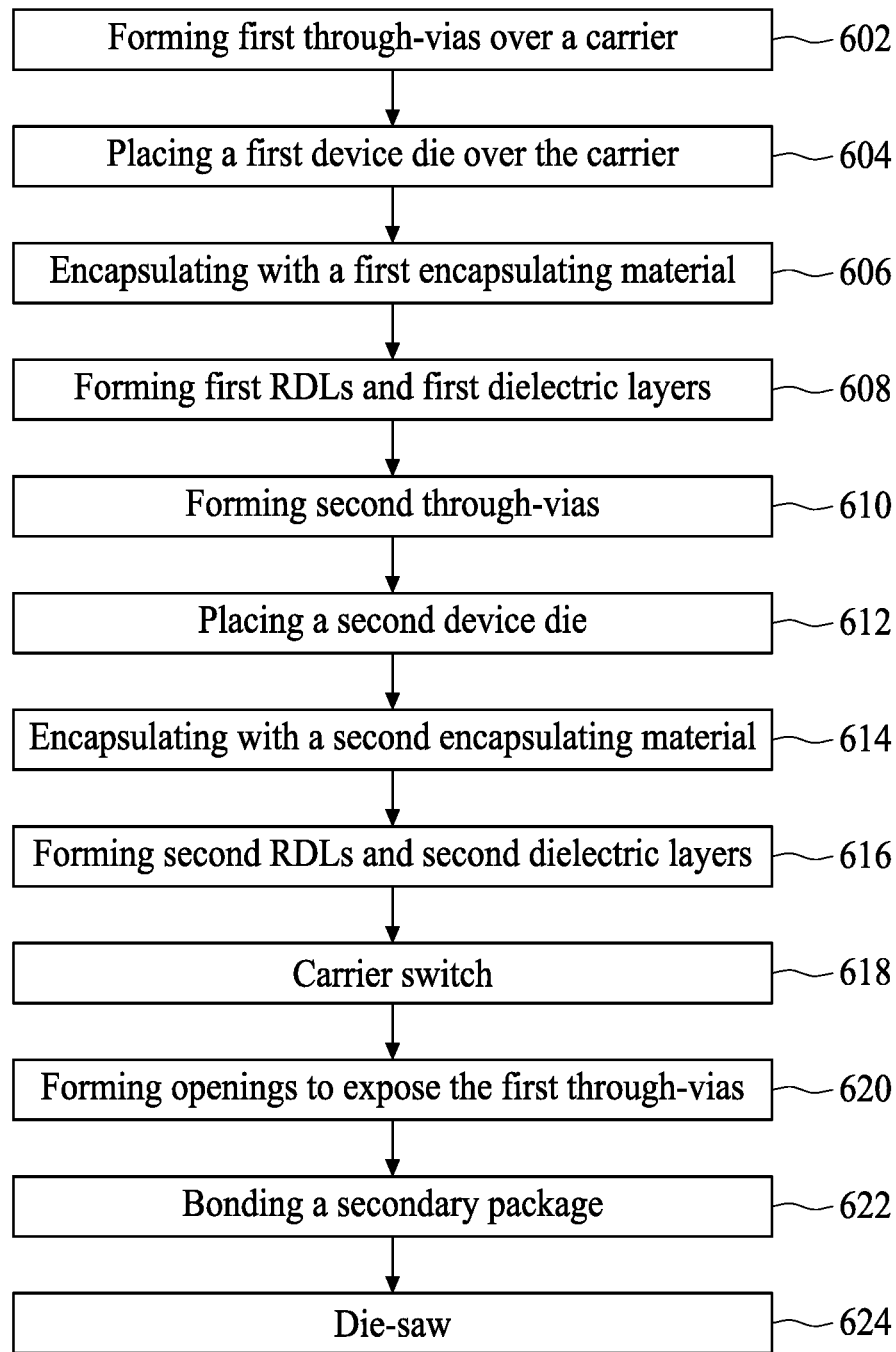
FIG. 17 illustrates a process flow for forming a package in accordance with some embodiments.

FIGS. 1 through 11A illustrate the cross-sectional views of intermediate stages in the formation of a package in accordance with some embodiments. In the subsequent discussion, the process steps shown in FIGS. 1 through 11A are discussed referring to the process flow 600 shown in FIG. 17.

Figure 2:
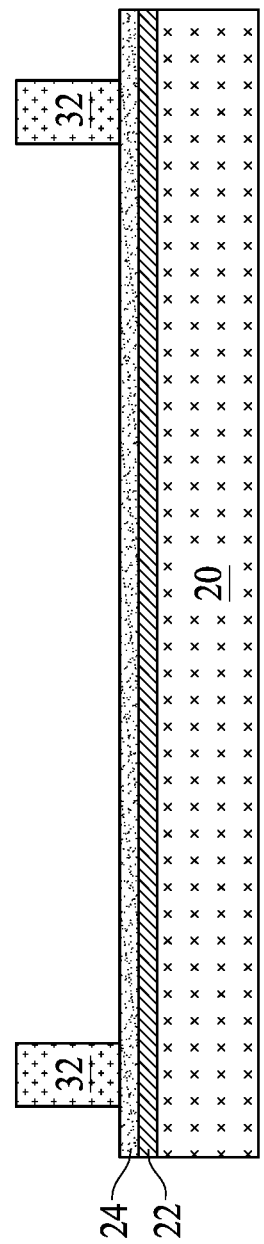

FIGS. 1 and 2 illustrate the formation of through-vias 32. The respective step is shown as step 602 in the process flow shown in FIG. 17. Referring to FIG. 1, carrier 20 is provided, and adhesive layer 22 is disposed over carrier 20. Carrier 20 may be a blank glass carrier, a blank ceramic carrier, or the like, and may have a shape of a semiconductor wafer with a round top-view shape. Carrier 20 is sometimes referred to as a carrier wafer. Adhesive layer 22 may be formed of a Light-to-Heat Conversion (LTHC) material, for example, although other types of adhesives may be used. In accordance with some embodiments of the present disclosure, adhesive layer 22 is capable of decomposing under the heat of light, and hence can release carrier 20 from the structure formed thereon.

Also referring to FIG. 1, dielectric layer 24 is formed over adhesive layer 22. In accordance with some embodiments of the present disclosure, dielectric layer 24 is a polymer layer formed of a polymer, which may be a photo-sensitive polymer such as polybenzoxazole (PBO), polyimide, or the like. In accordance with some embodiments, dielectric layer 24 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Conductive seed layer 26 is formed over dielectric layer 24, for example, through Physical Vapor Deposition (PVD). Conductive seed layer 26 may be a metal seed layer including copper, aluminum, titanium, alloys thereof, or multilayers thereof. In accordance with some embodiments of the present disclosure, conductive seed layer 26 includes a first metal layer such as a titanium layer (not shown) and a second metal layer such as a copper layer (not shown) over the first metal layer. In accordance with alternative embodiments of the present disclosure, conductive seed layer 26 includes a single metal layer such as a copper layer, which may be formed of substantially pure copper or a copper alloy.

As shown in FIG. 1, mask layer 28 (such as a photo resist) is applied over conductive seed layer 26, and is then patterned using a photo lithography mask. In accordance with some embodiments of the present disclosure, mask layer 28 is formed of a dry film, which is laminated onto conductive seed layer 26. In accordance with some embodiments, mask layer 28 is formed of a photo resist, which is applied by spin coating. As a result of the patterning (exposure and development), openings 30 are formed in mask layer 28, through which some portions of conductive seed layer 26 are exposed.

Through-vias 32 are formed in openings 30 through plating, which may be electro-plating or electro-less plating. Through-vias 32 are plated on the exposed portions of conductive seed layer 26. Through-vias 32 are conductive, and may be metal vias including copper, aluminum, tungsten, nickel, or alloys thereof. The top-view shapes of through-vias 32 include, and are not limited to, rectangles, squares, circles, and the like. The heights of through-vias 32 are determined by the thickness of the subsequently placed device dies 34 (FIG. 3), with the heights of through-vias 32 slightly greater than or equal to the thickness of device dies 34 in accordance with some embodiments of the present disclosure.

After the plating of through-vias 32, mask layer 28 is removed. As a result, the portions of conductive seed layer 26 that are previously covered by mask layer 28 are exposed. Next, an etching step is performed to remove the exposed portions of conductive seed layer 26, wherein the etching may be an anisotropic or isotropic etching. The portions of conductive seed layer 26 (FIG. 1) that are overlapped by through-vias 32, on the other hand, remain not etched. The resulting through-vias 32 are shown in FIG. 2. Throughout the description, the remaining underlying portions of conductive seed layer 26 are referred to as the bottom portions of through-vias 32, and are not shown separately. Conductive seed layer 26 and the overlying portions of through-vias 32 may or may not have distinguishable interfaces. For example, the copper layer in conductive seed layer 26 may be merged with through-vias 32 with no distinguishable interfaces. The titanium layer in conductive seed layer 26 may be distinguishable from the copper-containing through-vias 32. As a result of the etching of conductive seed layer 26, dielectric layer 24 is exposed.

Figure 3:
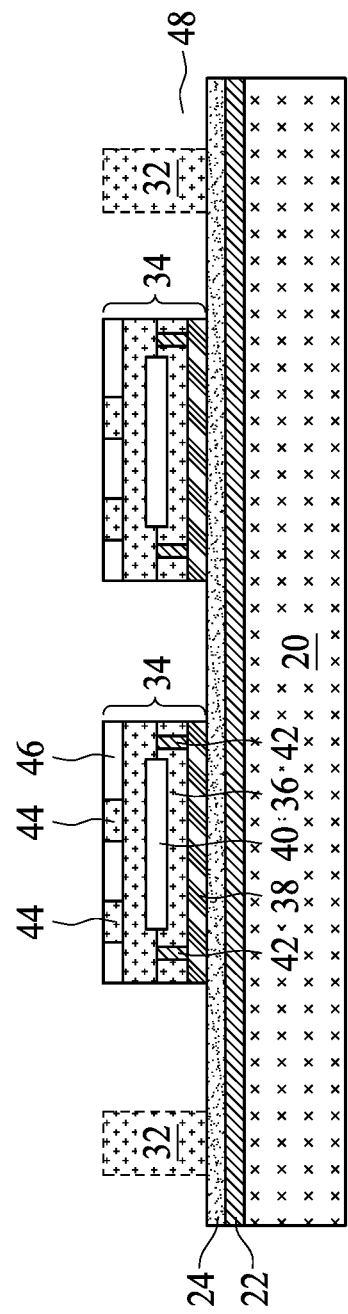

FIG. 3 illustrates the placement of device dies 34 over dielectric layer 24. The respective step is shown as step 604 in the process flow shown in FIG. 17. Device dies 34 may be adhered to dielectric layer 24 through die-attach films 38, which are adhesive films. The edges of die-attach films 38 are co-terminus with (aligned to) the respective edges of device dies 34. Device dies 34 may include semiconductor substrates 36 having back surfaces (the surfaces facing down) in physical contact with the respective underlying die-attach films 38. Device dies 34 further includes integrated circuit devices 40 (such as active devices or passive devices) at the front surfaces (the surfaces facing up) of the respective semiconductor substrates 36. Device dies 34 may be memory dies such as Static Random Access Memory (SRAM) dies, Dynamic Random Access Memory (DRAM) dies, flash memory dies, etc. Device dies 34 may be identical to each other.

In accordance with some embodiments, device dies 34 do not have through-vias in semiconductor substrates 36. In accordance with alternative embodiments, device dies 34 have through-vias 42 extending into semiconductor substrates 36. In the embodiments in which there are through-vias 42, through-vias 32 may not (or may) be formed since through-vias 42 may act as the electrical connections for interconnecting the conductive features overlying and underlying device dies 34. Accordingly, through-vias 32 do not have to be formed, and the respective manufacturing cost may be saved. In accordance with some embodiments, some or all of through-vias 42 are solely for electrically interconnecting the conductive features overlying and underlying device dies 34, and are not electrically connected/coupled to any active and passive devices 40 such as transistors, diodes, capacitors, resistors, etc. Throughout the description, when features (such as through-vias 32 and 42) are shown as dashed, it is indicated that these features may or may not be formed.

Device dies 34 may include metal pillars 44 close to their top surfaces. Metal pillars 44 are electrically coupled to integrated circuits 40 inside device dies 34. In accordance with some exemplary embodiments of the present disclosure, metal pillars 44 are covered by dielectric layers 46, with the top surfaces of dielectric layers 46 being higher than the top surfaces of metal pillars 44. Dielectric layers 46 further extend into the gaps between metal pillars 44. In accordance with alternative embodiments of the present disclosure, the top surfaces of metal pillars 44 are coplanar with the top surfaces of the respective dielectric layers 46. Dielectric layers 46 may be formed of a polymer such as polybenzoxazole (PBO) or polyimide in accordance with some exemplary embodiments. Metal pillars 44 may be copper pillars, and may also include other conductive/metallic materials such as aluminum, nickel, or the like.

Figure 4:
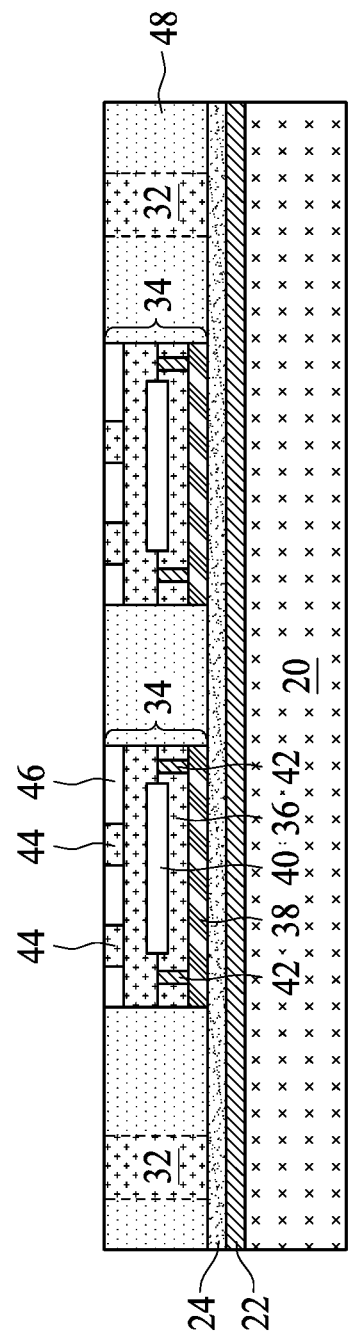

Referring to FIG. 4, encapsulating material 48 is encapsulated on device dies 34 and through-vias 32. The respective step is shown as step 606 in the process flow shown in FIG. 17. Encapsulating material 48 fills the gaps between neighboring device dies 34, and encircles each of device dies 34 and through-vias 32. Encapsulating material 48 may include a molding compound, a molding underfill, an epoxy, and/or a resin. After the encapsulating process, the top surface of encapsulating material 48 is higher than the top surfaces of metal pillars 44 and through-vias 32.

Next, a planarization step such as a Chemical Mechanical Polish (CMP) step or a grinding step is performed to planarize encapsulating material 48, until through-vias 32 are exposed. Metal pillars 44 of device dies 34 are also exposed as a result of the planarization. Due to the planarization, the top surfaces of through-vias 32 are substantially level (coplanar) with the top surfaces of metal pillars 44, and are substantially level (coplanar) with the top surface of encapsulating material 48.

Figure 5:
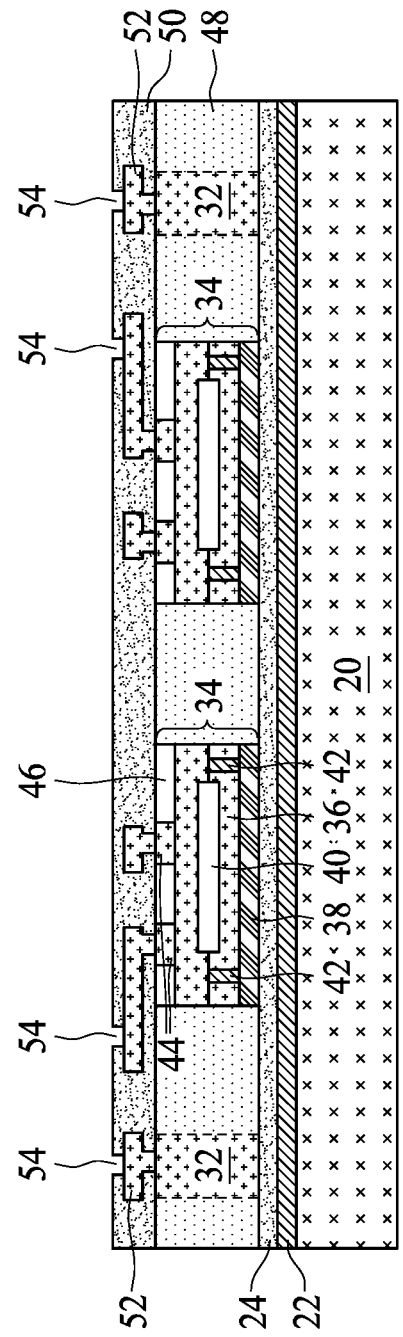

Referring to FIG. 5, a plurality of dielectric layers 50 and the respective Redistribution Lines (RDLs) 52 are formed over encapsulating material 48, through-vias 32, and metal pillars 44. The respective step is shown as step 608 in the process flow shown in FIG. 17. In accordance with some embodiments of the present disclosure, dielectric layers 50 are formed of a polymer(s) such as PBO, polyimide, or the like. In accordance with alternative embodiments of the present disclosure, dielectric layers 50 are formed of an inorganic dielectric material(s) such as silicon nitride, silicon oxide, silicon oxynitride, or the like.

RDLs 52 are electrically coupled to metal pillars 44 and through-vias 32, and may interconnect metal pillars 44 and through-vias 32 with each other. RDLs 52 may include metal traces (metal lines) and vias underlying and connected to the metal traces. In accordance with some embodiments of the present disclosure, RDLs 52 are formed through plating processes, wherein each of RDLs 52 includes a seed layer (not shown) and a plated metallic material over the seed layer. The seed layer and the plated metallic material may be formed of the same material or different materials.

Referring to FIG. 5, dielectric layers 50 include a top dielectric layer overlying RDLs 52, wherein some metal pads of RDLs 52 are exposed through openings 54 in the top dielectric layer 50.

Figure 6:
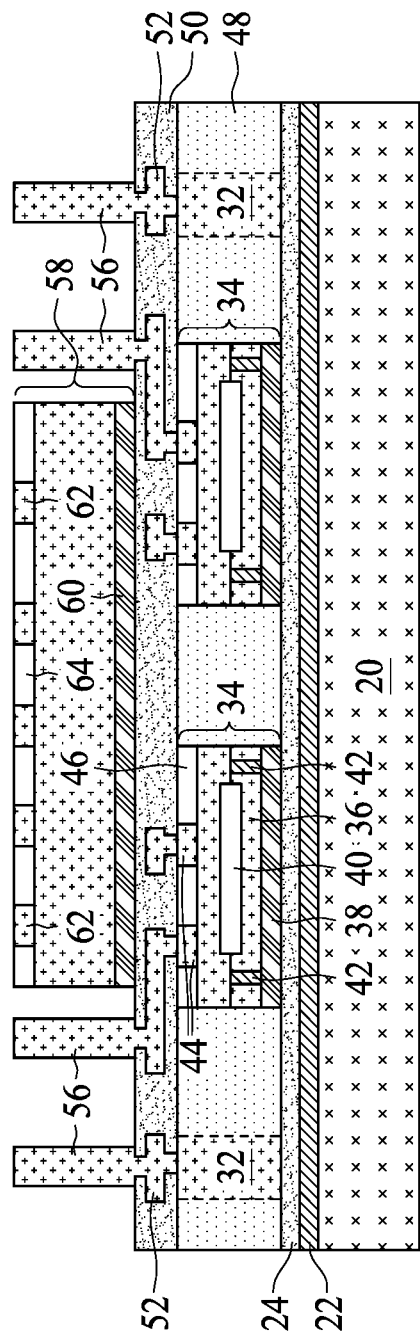

Next, Referring to FIG. 6, through-vias 56 are formed over dielectric layers 50 and RDLs 52. The respective step is shown as step 610 in the process flow shown in FIG. 17. The formation process may include forming a seed layer (not shown) over dielectric layers 50 and extending into openings 54 (FIG. 5), forming a patterned mask layer (not shown), with openings 54 exposed to the openings in the patterned mask layer, plating through-vias 56 in the openings in the patterned mask layer, removing the patterned mask layer, and etching the seed layer.

The seed layer of through-vias 56 may include a titanium layer and a copper layer over the titanium layer. The plated material may have a uniform composition and may be formed of copper or a copper alloy. The plated material includes some portions over the top surface of the top dielectric layer 50, and other portions extending into openings 54 (FIG. 5).

FIG. 6 also illustrates the adhesion of device die 58 onto dielectric layers 50 through, for example, die-attach film 60. The respective step is shown as step 612 in the process flow shown in FIG. 17. The back surface of device die 58, which back surface may be the back surface of the semiconductor substrate in device die 58, is in contact with die-attach film 60. Device die 58 may be a logic die such as a Central Processing Unit (CPU) die, a Graphic Processing Unit (GPU) die, or the like. Device die 58 includes metal pillars 62 in surface dielectric layer 64. Surface dielectric layer 64 may be formed of PBO, for example, or other dielectric materials.

Figure 7:
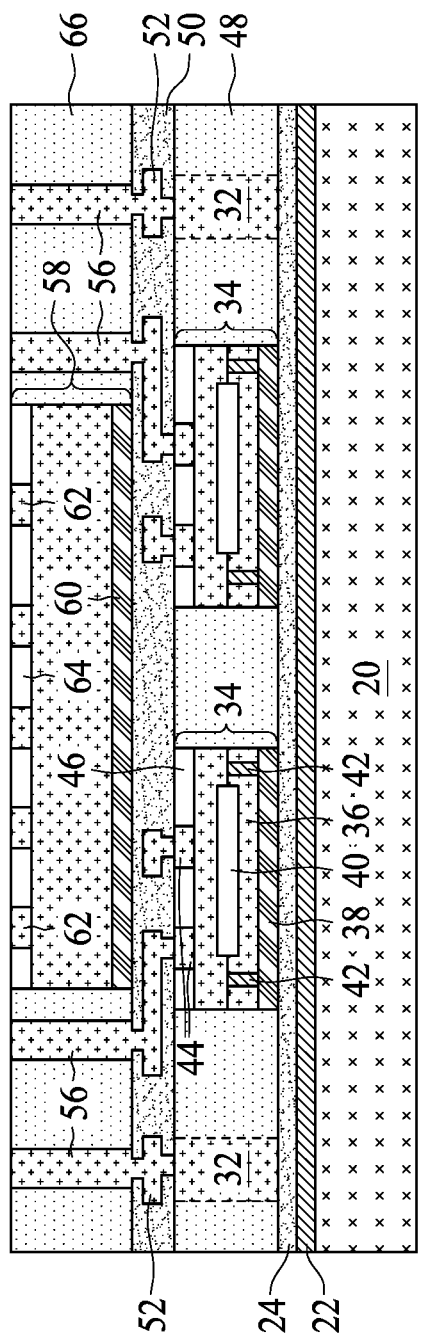

FIG. 7 illustrates the encapsulation of through-vias 56 and device dies 58 with encapsulating material 66. The respective step is shown as step 614 in the process flow shown in FIG. 17. Encapsulating material 66 may be a molding compound. After the dispensing and the curing of the encapsulating material 66, a planarization is performed to remove excess encapsulating material 66, so that through-vias 56 and metal pillars 62 are exposed.

Figure 8:
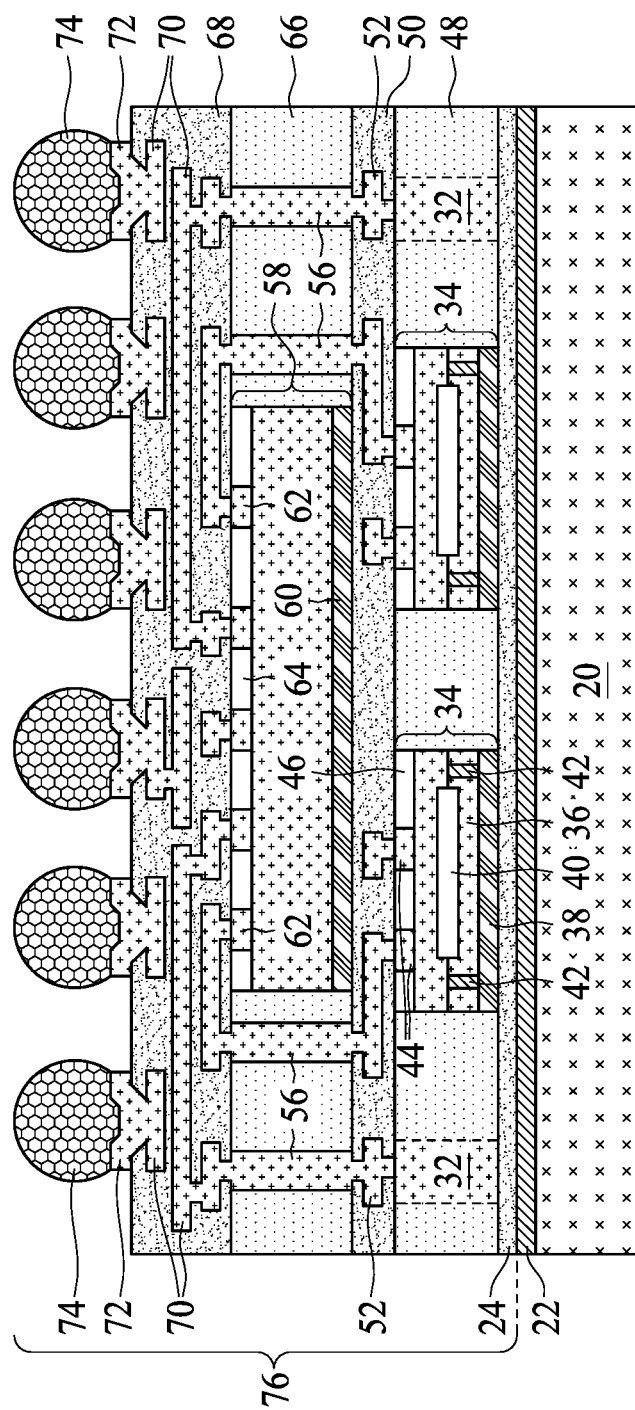

Next, referring to FIG. 8, dielectric layers 68 and RDLs 70 are formed over encapsulating material 66 and device dies 58. The respective step is shown as step 616 in the process flow shown in FIG. 17. Dielectric layers 68 may also be formed of polymers such as PBO or polyimide. RDLs 70 are electrically coupled to through-vias 56 and metal pillars 62. Furthermore, RDLs 70 may also electrically connect through-vias 56 to metal pillars 62.

Further referring to FIG. 8, Under-Bump-Metallurgies (UBMs) 72 and electrical connectors 74 are formed in accordance with some exemplary embodiments of the present disclosure. Electrical connectors 74 are electrically coupled to RDLs 70 and 52, metal pillars 62 and 44, and/or through-vias 32, 42, and 56. The formation of electrical connectors 74 may include placing solder balls over RDLs 70, and then reflowing the solder balls. In accordance with alternative embodiments of the present disclosure, the formation of electrical connectors 74 includes performing a plating process to form solder regions over RDLs 70 and then reflowing the solder regions. Electrical connectors 74 may also include metal pillars, or metal pillars and solder caps, which may also be formed through plating.

Figure 9:
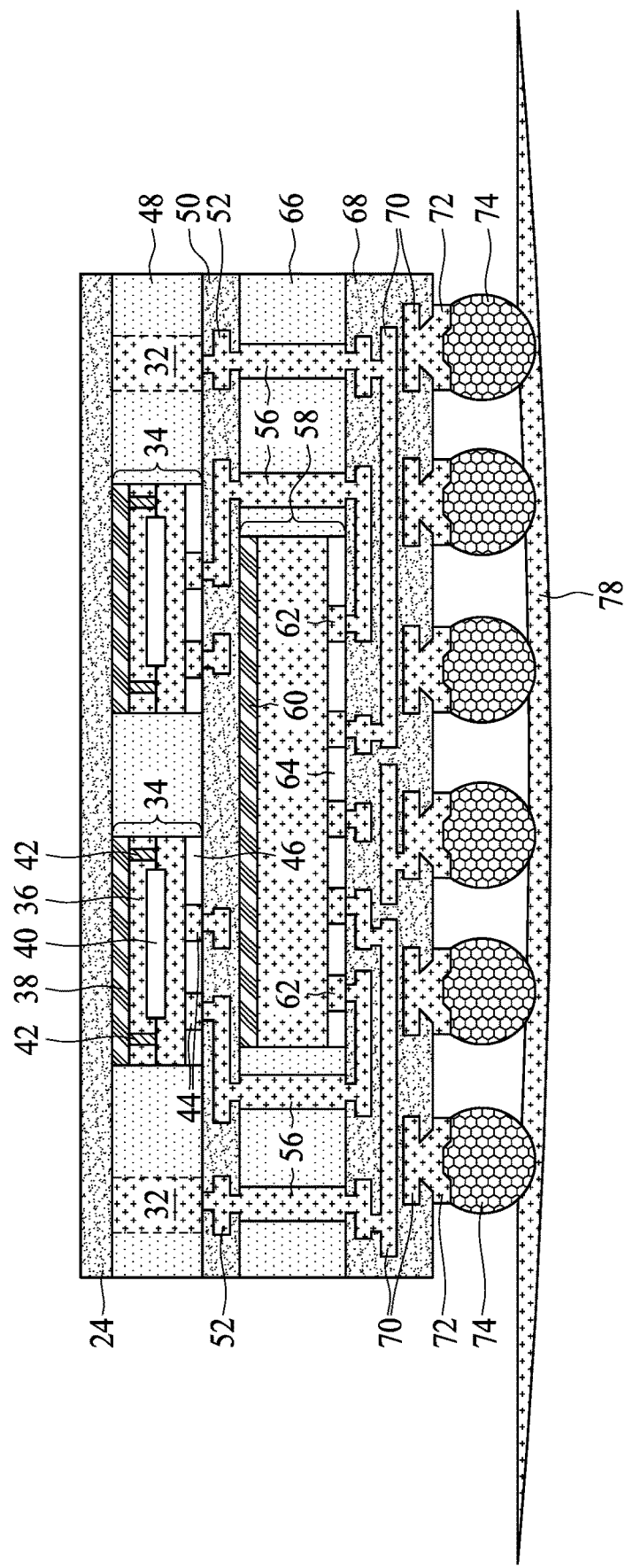

Throughout the description, the structure overlying adhesive layer 22 is referred to as wafer-level package 76, which may be a composite wafer. Next, package 76 is de-bonded from carrier 20. In accordance with some exemplary de-bonding processes, as shown in FIG. 9, carrier 78 is attached to package 76 to protect electrical connectors 74. The respective step is shown as step 618 in the process flow shown in FIG. 17. Carrier 78 may be a dicing tape fixed onto a dicing frame (not shown). The de-bonding is performed, for example, by projecting a UV light or a laser on adhesive layer 22 (FIG. 8). For example, when adhesive layer 22 is formed of LTHC, the heat generated from the light or laser causes the LTHC to be decomposed, and hence carrier 20 is detached from wafer-level package 76. The resulting structure is shown in FIG. 9.

Figure 10:
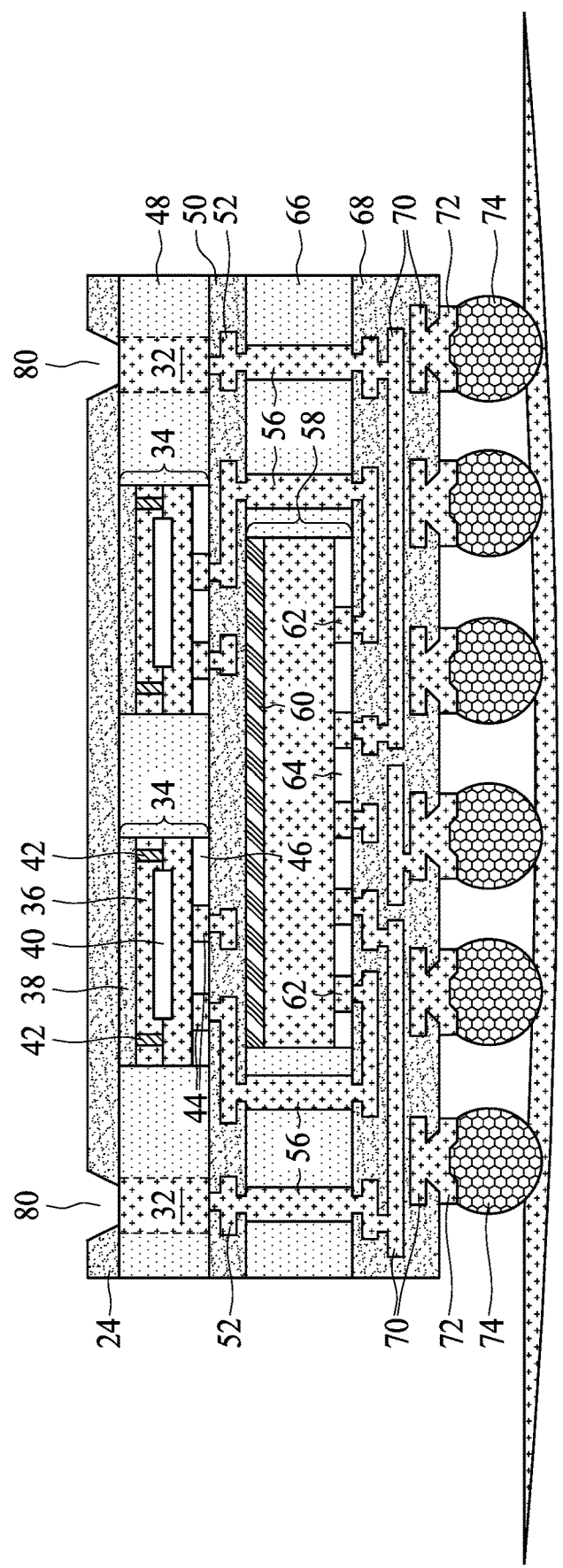

FIG. 10 illustrates the patterning for forming openings 80 in dielectric layer 24. The respective step is shown as step 620 in the process flow shown in FIG. 17. For example, when dielectric layer 24 is a polymer layer, it can be patterned using laser drill to remove the portions overlapping through-vias 32, so that through-vias 32 are exposed through openings 80.

Figure 11A:
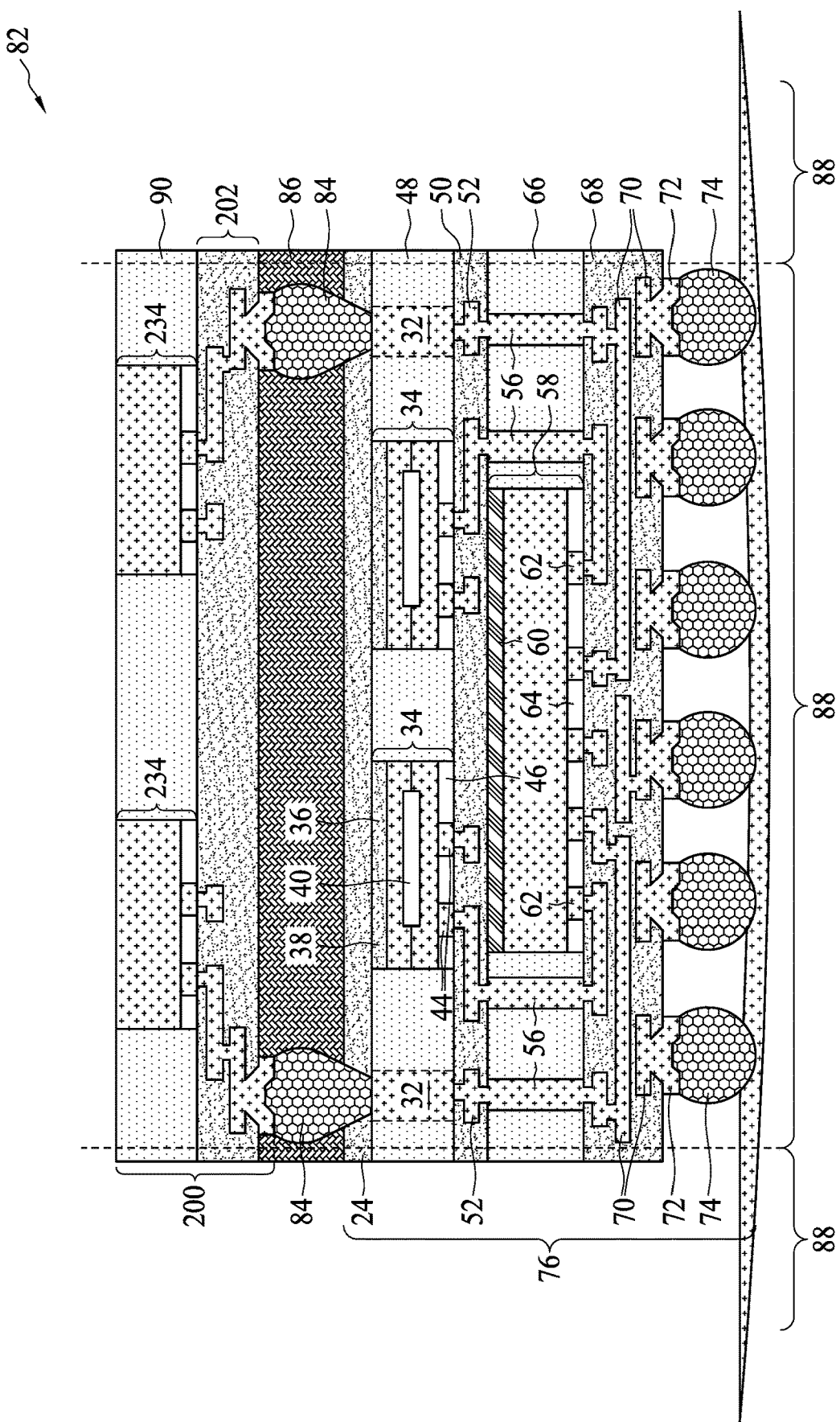

FIG. 11A illustrates the bonding of package 200 to package 76, thus forming PoP package 82. The respective step is shown as step 622 in the process flow shown in FIG. 17. Packages 76 and 200 are also referred to as a primary package and a secondary package, respectively. The bonding is performed through solder regions 84, which join through-vias 32 to the metal pads in the overlying package 200. In accordance with some embodiments of the present disclosure, package 200 includes device die(s) 234, which may be memory dies such as SRAM dies, DRAM dies, or the like. Device dies 234 may also be identical to device dies 34. The memory dies are also bonded to package substrate 202 in accordance with some exemplary embodiments. Encapsulating material 90 encapsulates device dies 234 therein, wherein encapsulating material 90 may be a molding compound, a molding underfill, etc. After the bonding of secondary package 200 to primary package 76, underfill 86 is dispensed into the gap between secondary package 200 and primary package 76, and is then cured. A die-saw may then be performed to saw package 82 into individual packages 88, which are identical to each other. The respective step is shown as step 624 in the process flow shown in FIG. 17.

As a result of the die-saw, the respective edges of encapsulating material 48, encapsulating material 66, dielectric layers 50, and dielectric layers 68 are aligned with each other. The edges of encapsulating material 90 and package substrate 202 may or may not be aligned to the edges of underlying package 76.

Figure 11B:
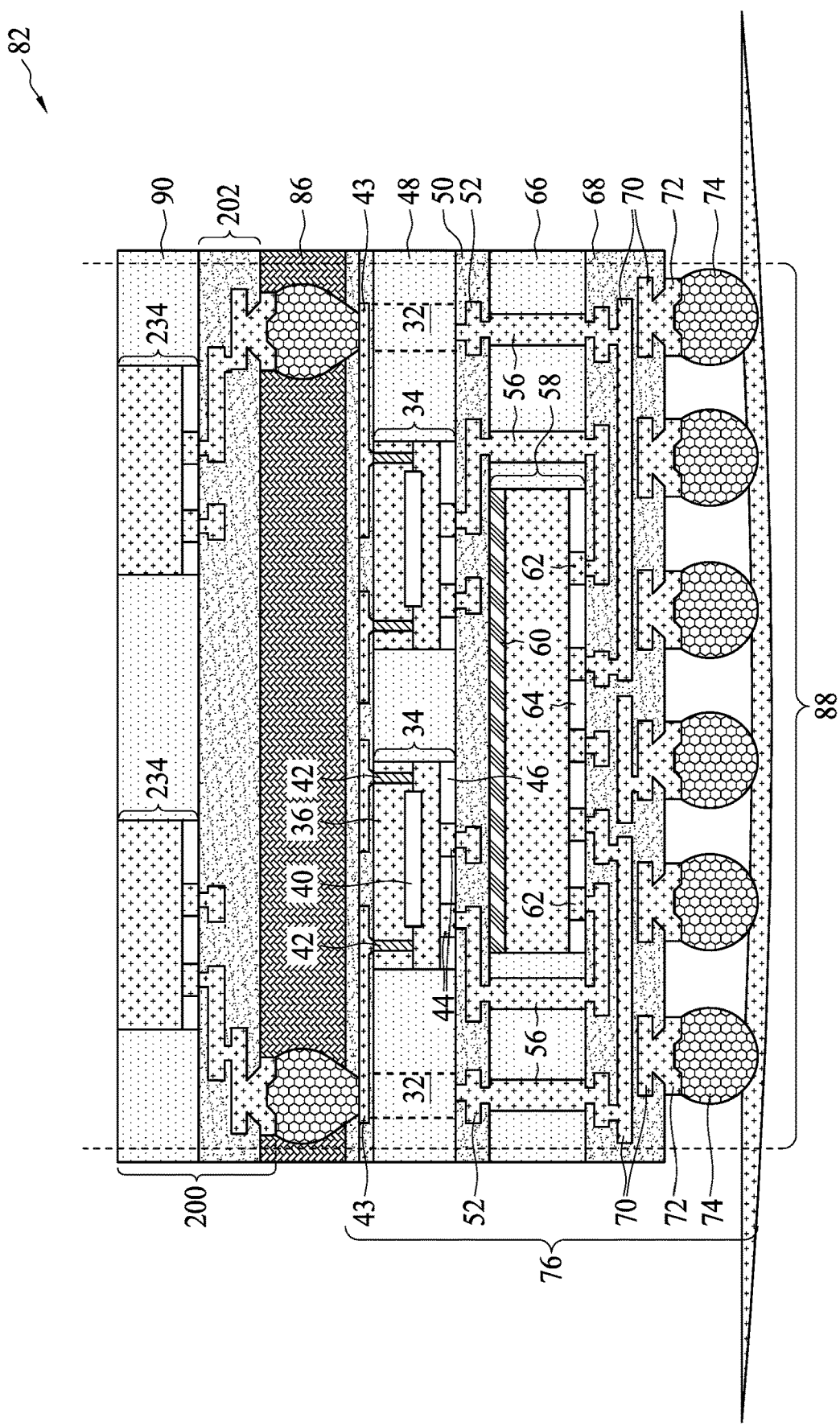

In accordance with some embodiments in which through-vias 42 are formed, after the structure as shown in FIG. 9 is formed, a backside grinding is performed to remove die-attach films 38 and some portions of semiconductor substrates 36, until through-vias 42 are exposed. Next, as shown in FIG. 11B, RDLs 43 are formed over and electrically coupled to through-vias 42. Through-vias 32 may or may not be formed in accordance with some embodiments when through-vias 42 are formed. In accordance with some embodiments, through-vias 42 act as the interconnection between RDLs 43 and RDLs 52 (through metal lines and vias (not shown) between through-vias 42 and metal pillars 44). Through-vias 42 may be used solely for the interconnection of RDLs 43 and 52, and are not electrically coupled to any passive or active device in device dies 34. This has the advantageous feature of increasing the total number of through-vias since through-vias 42 may be formed smaller than through-vias 32. In addition, the cost that otherwise will be incurred for forming through-vias 32 is saved.

In the package shown in FIGS. 11A and 11B, device dies 58, 34, and 234 form a multi-stack package including two encapsulating regions/materials separated by intermediate dielectric layers 50 and RDLs 52. Stacking device dies 34 over the encapsulated device die 58 results in a very thin package since no solder joints are used between device dies 34 and device die 58. In addition, two or more device dies 34 may be located in the same encapsulating material 48, and hence the height of package 88 is further reduced. The footprint (top-view area) of package 88, however, is not increased since device die 58 has a larger top-view area than device dies 34.

FIGS. 12 through 16 illustrate packages 88 in accordance with some embodiments of the present disclosure. Unless specified otherwise, the materials and the formation methods of the components in these embodiments are essentially the same as the like components, which are denoted by like reference numerals in the embodiments shown in FIGS. 1 through 11A and 11B. The details regarding the formation processes and the materials of the components shown in FIGS. 12 through 16 may thus be found in the discussion of the embodiments shown in FIGS. 1 through 11A and 11B. In each of these embodiments, device dies 234 may be identical to or different from device dies 34. Furthermore, in the embodiments shown in each of FIGS. 12 through 16, either through-vias 32 or through-vias 42 are formed, or both through-vias 32 and through-vias 42 are formed.

Figure 12:
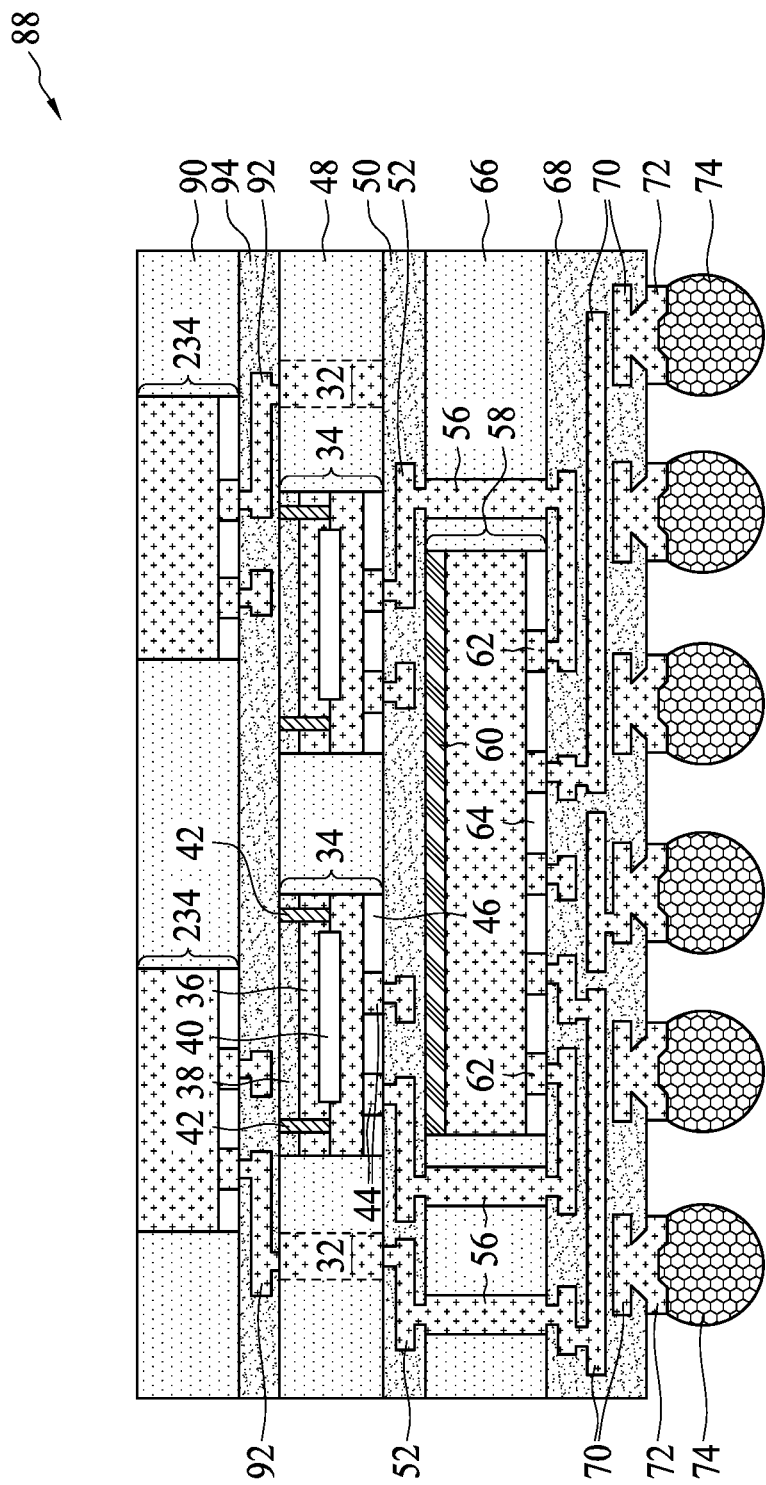

FIG. 12 illustrates package 88 that has no solder regions between different levels of device dies 58, 34, and 234. Device dies 234 are electrically coupled to device dies 34 through RDLs 92, which are formed in dielectric layers 94. In accordance with some embodiments of the present disclosure, the formation process of the structure in FIG. 12 may include encapsulating device dies 234 in encapsulating material 90, followed by forming RDLs 92 and dielectric layers 94. The subsequent steps are essentially shown in FIGS. 1 through 8. By using the embodiments in FIG. 12, the thickness of the resulting package 88 is further reduced since there is no solder region in the resulting package.

Figure 13:
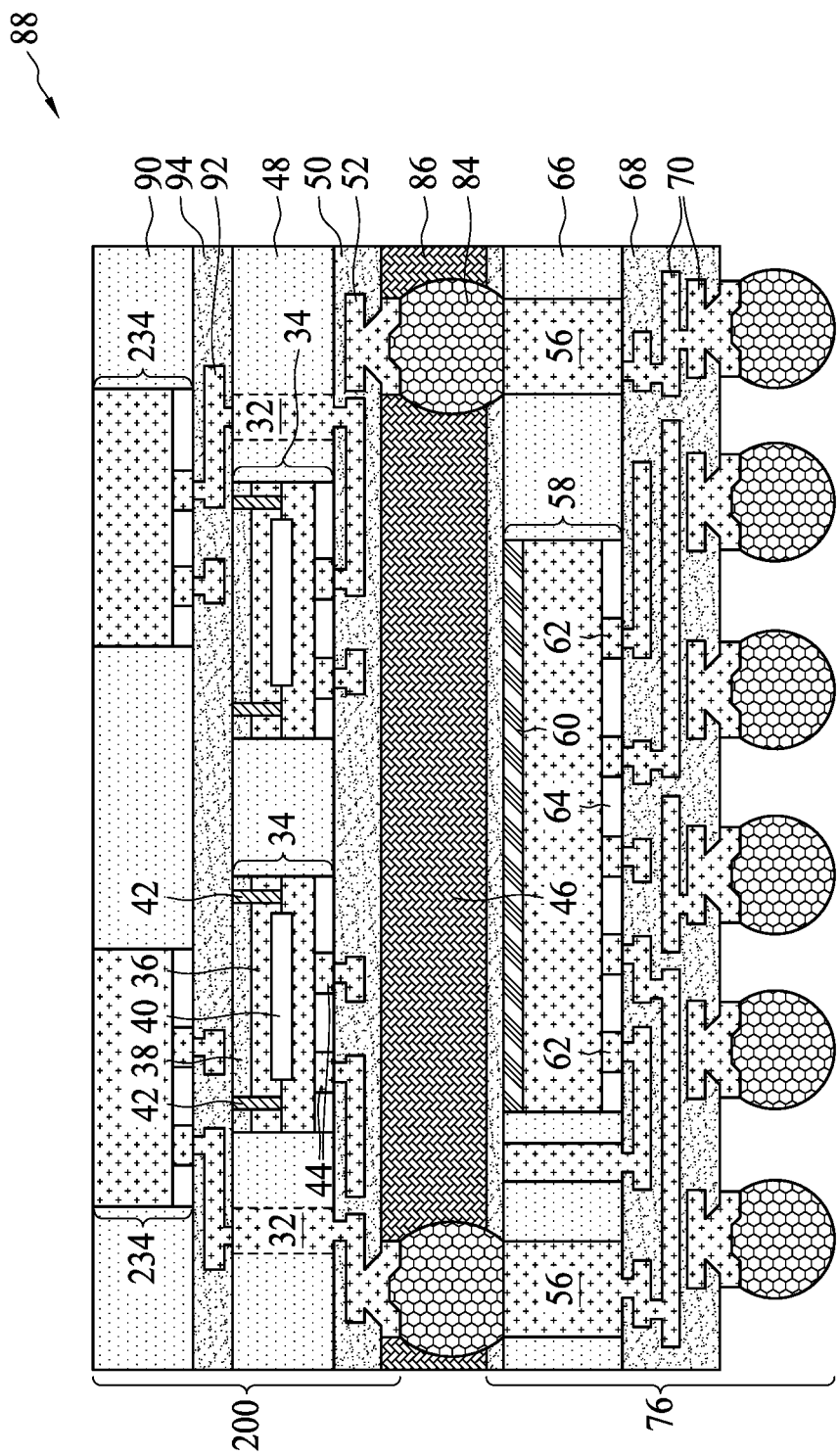

FIG. 13 illustrates package 88 in accordance with some embodiments. These embodiments are similar to the embodiments in FIGS. 11A and 11B, except primary package 76 has a single level of device die 58, while secondary package 200 includes multi-stacked device dies 34 and 234.

Figure 14:
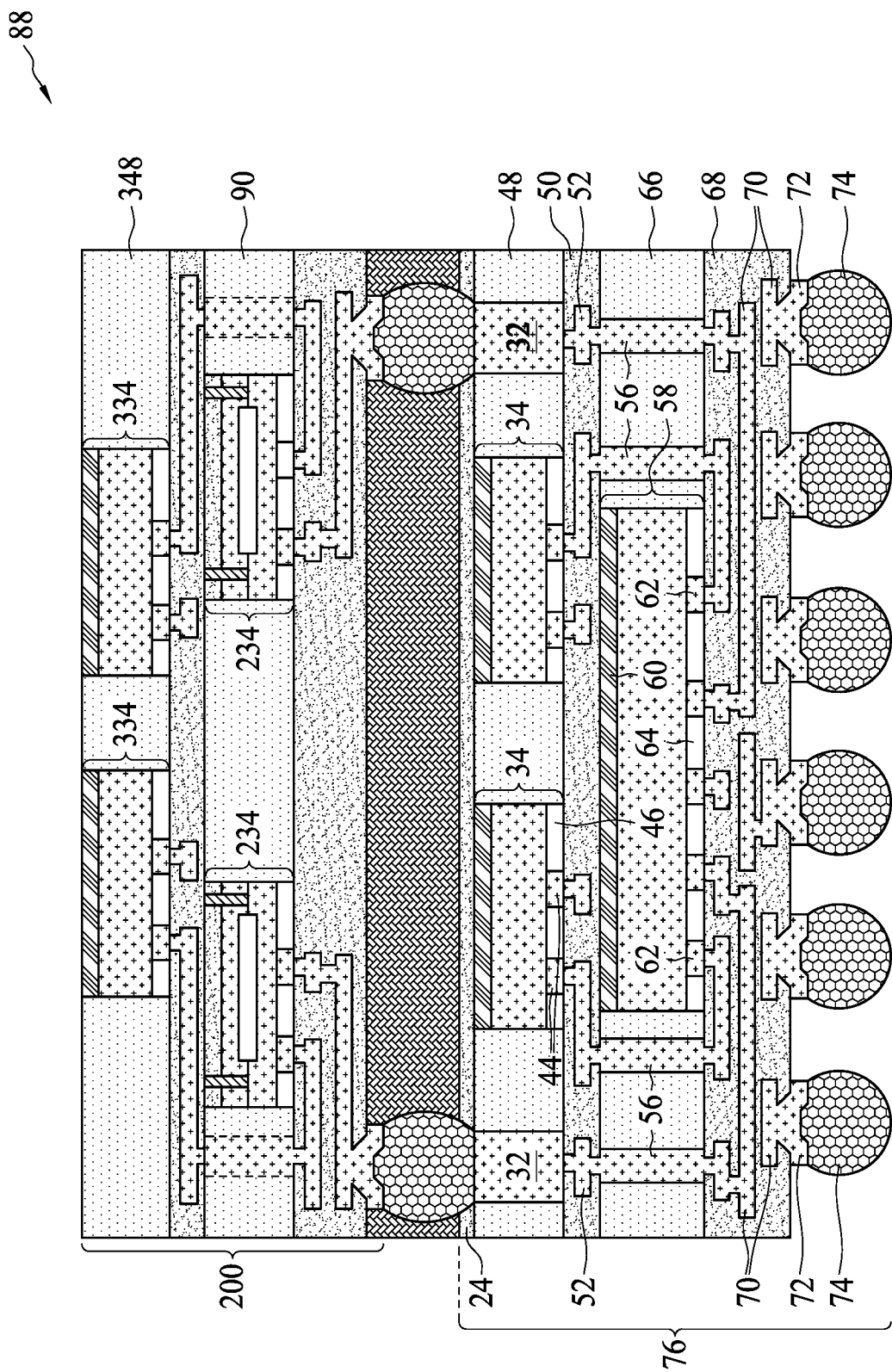

FIG. 14 illustrates package 88 in accordance with some embodiments. These embodiments are similar to the embodiments in FIGS. 11A and 11B, except both primary package 76 and secondary package 200 include multi-stacked device dies. For example, primary package 76 includes device die 58 and device dies 34 forming a multi-stack package. Secondary package 200 includes device die 234 and device dies 334 forming a multi-stack package. Device dies 234 may be identical to device dies 334 or different from device dies 334. Device die 334 are further encapsulated in encapsulating material 348.

Figure 15:
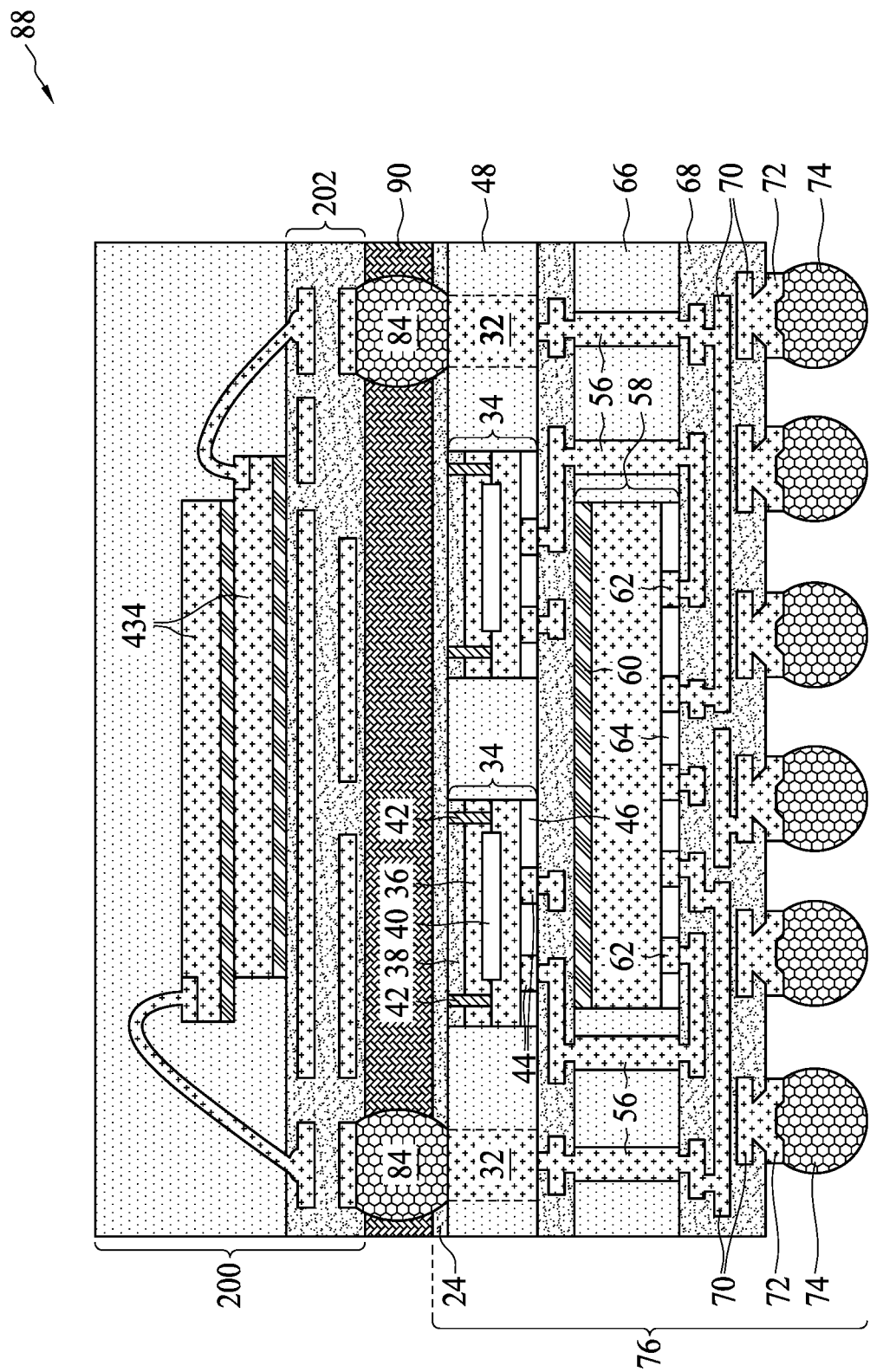

FIG. 15 illustrates package 88 in accordance with some embodiments. These embodiments are similar to the embodiments in FIGS. 11A and 11B, except secondary package 200 includes device dies 434 that are bonded to the respective package substrate 202 through wire bonds. Device dies 34 may be different from device dies 234. For example, device dies 34 may be DRAM dies, while device dies 234 may be flash memory dies.

Figure 16:
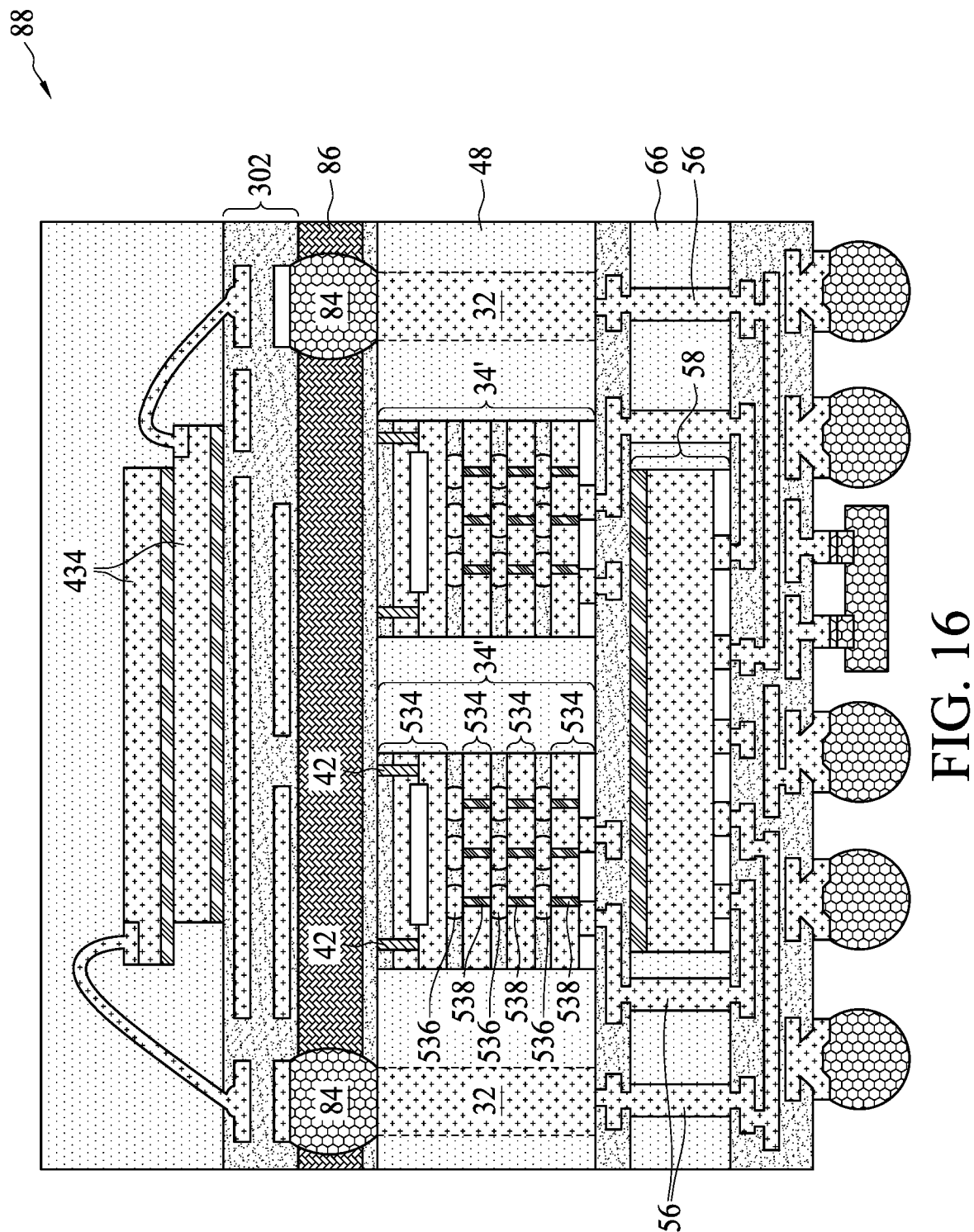

FIG. 16 illustrates package 88 in accordance with some embodiments. These embodiments are similar to the embodiments in FIG. 15, except the device dies 34 in FIG. 15 are replaced by die stacks 34', with each of the die stacks 34' including a plurality of device dies 534 bonded together. Die stacks 34' are pre-formed before being used to form package 88. Device dies 534 in die stacks 34' are bonded by solder regions 536. Furthermore, device dies 534 include through-vias 538 penetrating through the respective semiconductor substrates.

The embodiments of the present disclosure have some advantageous features. By forming multi-stack packages, the solder regions that are used in conventional Package-on-Package (PoP) structures are either eliminated or at least reduced in number. Accordingly, the thickness of the resulting package is reduced.

In accordance with some embodiments of the present disclosure, a package includes a first device die, and a first encapsulating material encapsulating the first device die therein. A bottom surface of the first device die is coplanar with a bottom surface of the first encapsulating material. First dielectric layers are underlying the first device die. First redistribution lines are in the first dielectric layers and electrically coupling to the first device die. Second dielectric layers are overlying the first device die. Second redistribution lines are in the second dielectric layers and electrically coupling to the first redistribution lines. A second device die is overlying and electrically coupling to the second redistribution lines. No solder region connects the second device die to the second redistribution lines. A second encapsulating material encapsulates the second device die therein. A third device die is electrically coupled to the second redistribution lines. A third encapsulating material encapsulates the third device die therein.

In accordance with some embodiments of the present disclosure, a method includes placing a first device die over a carrier, encapsulating the first device die in a first encapsulating material, performing a first planarization to reveal first metal pillars in the first device die, forming first dielectric layers over the first device die and the first encapsulating material, and forming first redistribution lines in the first dielectric layers. The first redistribution lines are electrically coupled to the first metal pillars. The method further includes adhering a second device die to a top surface of the first dielectric layers, forming a first through-via over the first dielectric layers, encapsulating the second device die and the first through-via in a second encapsulating material, performing a second planarization to reveal the first through-via and second metal pillars in the second device die, forming second dielectric layers over the second device die, and forming second redistribution lines in the second dielectric layers. The second redistribution lines are electrically coupled to the second metal pillars and the first through-via.

In accordance with some embodiments of the present disclosure, a method includes placing a first device die over a carrier. The first device die includes a first semiconductor substrate, and first through-vias penetrating through the first semiconductor substrate. The method further includes encapsulating the first device die in a first encapsulating material, forming first dielectric layers over the first device die, and forming first redistribution lines in the first dielectric layers. The first redistribution lines are electrically coupled to first metal pillars in the first device die. A second device die is adhered to a top surface of the first dielectric layers. Second through-vias are formed over the first dielectric layers. The second through-vias are electrically coupled to the first redistribution lines. The method further includes encapsulating the second device die in a second encapsulating material, forming second dielectric layers over the second device die, and forming second redistribution lines in the second dielectric layers. The second redistribution lines are electrically coupled to second metal pillars in the second device die. The carrier is de-bonded from the first device die. A backside grinding is performed on the semiconductor substrate to reveal the first through-vias. Third redistribution lines are formed to electrically couple to the first through-vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a first interconnect structure comprising a plurality of dielectric layers and a first plurality of redistribution lines in the plurality of dielectric layers;
a first device die over the first interconnect structure;
a first encapsulant encapsulating the first device die therein;
a second interconnect structure over the first encapsulant, wherein the second interconnect structure comprises a second plurality of redistribution lines therein;
a first plurality of through-vias penetrating through the first encapsulant, wherein the first plurality of through-vias electrically connect the first plurality of redistribution lines to the second plurality of redistribution lines;
a second device die over and bonding to the second interconnect structure, wherein the second device die comprises a semiconductor substrate, and a second plurality of through-vias penetrating through the semiconductor substrate;
a second encapsulant encapsulating the second device die therein; and
a third interconnect structure comprising a third plurality of redistribution lines therein, wherein the third interconnect structure is over and contacting the second encapsulant, and wherein the third plurality of redistribution lines are electrically connected to the second plurality of redistribution lines through the second plurality of through-vias in the semiconductor substrate.

2. The package of claim 1, wherein the second device die comprises metal pillars physically bonding to the second plurality of redistribution lines through flip-chip bonding.

3. The package of claim 1 further comprising a die-attach film adhering the first device die to the second interconnect structure.

4. The package of claim 1 further comprising a third device die overlying the third interconnect structure.

5. The package of claim 4, wherein no solder region is between the third device die and the first plurality of redistribution lines.

6. The package of claim 4 further comprising solder regions electrically coupling the third device die to the third plurality of redistribution lines.

7. The package of claim 4 further comprising a third through-via penetrating through the second encapsulant, wherein the third through-via electrically couples the third device die to the second plurality of redistribution lines.

8. The package of claim 1, wherein the second encapsulant is free from through-vias therein.

9. The package of claim 1, wherein the second plurality of through-vias are electrically decoupled from all active and passive devices in the second device die.

10. The package of claim 1, wherein respective edges of the first interconnect structure, the second interconnect structure, the third interconnect structure, the first encapsulant, and the second encapsulant are flush with each other.

11. A package comprising:
a first interconnect structure;
a first device die over the first interconnect structure;
a first encapsulant encapsulating the first device die therein;
a first through-via in the first encapsulant;
a second interconnect structure;
a second device die over the second interconnect structure, wherein the second device die comprises a semiconductor substrate, and a second through-via penetrating through the semiconductor substrate;
a third interconnect structure over the second device die; and
a third device die over the third interconnect structure, wherein the third device die is electrically coupled to the first interconnect structure through the second through-via, the second interconnect structure, and the first through-via.

12. The package of claim 11, wherein the first device die is bonded to the first interconnect structure through flip-chip bonding, and the second device die is bonded to the second interconnect structure through flip-chip bonding.

13. The package of claim 11 further comprising a second encapsulant encapsulating the second device die therein, wherein no through-via is in the second encapsulant.

14. The package of claim 11 further comprising:
a second encapsulant encapsulating the second device die therein; and
a third through-via in the second encapsulant.

15. The package of claim 11 further comprising a solder region between, and electrically interconnecting, the third device die and the second interconnect structure.

16. The package of claim 11 further comprising a solder region between, and electrically interconnecting, the second interconnect structure and the first interconnect structure.

17. A package comprising:
a first interconnect structure;
a first device die over and physically bonding to the first interconnect structure;
a second interconnect structure over the first device die;
a die-attach film, with a back surface of the first device die attached to the second interconnect structure through the die-attach film;
a plurality of through-vias between, and physically joined to both of, the first interconnect structure and the second interconnect structure;

a second device die over the second interconnect structure, wherein the second device die comprises conductive features at a top side and a bottom side of the second device die; and a third interconnect structure over the second device die, wherein the conductive features are bonded to both of the second interconnect structure and the third interconnect structure.

18. The package of claim 17 further comprising:

a third device die over the third interconnect structure, wherein the third device die is electrically coupled to the first interconnect structure through the second device die, the second interconnect structure, and the plurality of through-vias.

19. The package of claim 17, wherein a top surface of the die-attach film and top surfaces of the plurality of through-vias are in contact with a same dielectric layer in the second interconnect structure.

20. The package of claim 17 further comprising an underfill over and contacting the third interconnect structure.

* * * * *